(12) United States Patent
Yoshida

(10) Patent No.: US 6,677,644 B2
(45) Date of Patent: Jan. 13, 2004

(54) SEMICONDUCTOR INTEGRATED CIRCUIT HAVING LOW VOLTAGE AND HIGH VOLTAGE TRANSISTORS

(75) Inventor: Yoshifumi Yoshida, Chiba (JP)

(73) Assignee: Seiko Instruments Inc., Chiba (JP)

( * ) Notice: Subject to any disclaimer, the term of this patent is extended or adjusted under 35 U.S.C. 154(b) by 22 days.

(21) Appl. No.: 09/893,724

(22) Filed: Jun. 28, 2001

(65) Prior Publication Data

US 2002/0008262 A1 Jan. 24, 2002

(30) Foreign Application Priority Data

Jul. 5, 2000 (JP) ........................................ 2000-203404

(51) Int. Cl.[7] ............................................. H01L 29/786
(52) U.S. Cl. ...................................... 257/347; 257/350
(58) Field of Search ................................. 257/295, 300, 257/301, 304, 303, 374, 395, 360, 345, 349, 361, 358, 394, 347, 348, 350, 352, 353, 354

(56) References Cited

U.S. PATENT DOCUMENTS 5,187,552 A * 2/1993 Hendrickson et al.
5,424,979 A * 6/1995 Morii
5,751,041 A * 5/1998 Suzuki et al.
5,858,876 A * 1/1999 Chew
5,869,872 A * 2/1999 Asai et al.

* cited by examiner

Primary Examiner—Nathan J. Flynn
Assistant Examiner—Kevin Quinto
(74) Attorney, Agent, or Firm—Adams & Wilks

(57) ABSTRACT

An integrated circuit formed on a SOI substrate has a low withstand voltage MOS transistors formed in the SOI substrate and comprising source and drain regions formed in the semiconductor film of the SOI substrate, a gate insulating film formed over the semiconductor film between the source and drain regions, and a gate electrode formed over the gate insulating film. High withstand voltage MOS transistors are formed in the SOI substrate and comprise openings formed in the semiconductor film to expose the insulating film, a gate electrode formed of a portion of the semiconductor film between the openings, a gate oxide film comprised of the insulating film on the supporting substrate under the gate electrode, and a polysilicon film formed on the gate electrode so as to come in contact with a sidewall of the gate electrode and the insulating film at a bottom surface of the openings.

10 Claims, 3 Drawing Sheets

SEMICONDUCTOR INTEGRATED CIRCUIT HAVING LOW VOLTAGE AND HIGH VOLTAGE TRANSISTORS

BACKGROUND OF THE INVENTION

1. Field of the Invention

The present invention relates to a semiconductor integrated circuit that is formed on a semiconductor film provided through an insulating film, known as "silicon on insulator" (SOI) on a supporting substrate.

2. Description of the Related Art

FIG. 3A shows a structure of a conventional transistor provided on an SOI layer. The transistor is formed on a supporting substrate 1 provided with an insulating film 2 and has a polysilicon gate electrode 20, a gate insulating film 21, source and drain regions 22 and 23, a LOCOS 26, contacts 24 and 25, an interlayer insulating film 27, and metal wirings 28 and 29. Here, in the transistor for operation with low voltage, the thickness of the SOI layer is 100 nm or less, and the thickness of the insulating film on the supporting substrate is approximately 100 nm. Since the SOI layer is very thin, the source and drain regions 22 and 23 reach the 2 insulating film 2 on the supporting substrate 1. Further, the gate insulating film 21 is very thin in order to perform the operation with low voltage.

In recent years, low power consumption semiconductor integrated circuits have been demanded, and low voltage operation of internal circuits has been progressing. The shift to low voltage is easy in a digital circuit portion used for signal processing and the like, but the shift to low voltage is difficult in an interface portion, for example, a display portion and a radio transmitting and receiving portion. Therefore, the interface portion is operated with a high voltage. In order to mount an interface circuit or the like on a semiconductor integrated circuit consisting of transistors that operate with a low voltage, a method of thickening only a gate insulating film 30 of a transistor that handles a high voltage is used, as shown in FIG. 3B. With such a structure, the desired withstand voltage of the gate insulating film is secured and the reliability is improved.

Further, with respect to the transistor for operation with low voltage, the need to provide a countermeasure for static electricity protection is a problem. Since the structure of the transistor is intended for operation with low voltage, the transistor is immediately destroyed when a high voltage such as static electricity enters the transistor. Thus, a protective transistor is added in order to release the static electricity from the transistor. However, since the SOI layer is thin, and the source and drain regions 22 and 23 reach the insulating film 2 on the supporting substrate 1, a junction area of a PN junction is very small in comparison with a bulk device. Therefore, the size of the protective transistor is considerably large. Besides, since a 501 device is covered with an oxide film, there is no current path for a case where negative static electricity enters the transistor. Therefore, the transistor has to be further added with a diode for dealing with negative static electricity.

In the semiconductor integrated circuit formed on the SOI layer, the difference in thickness of a gate oxide film is prepared between a transistor with low voltage operation and a transistor with high withstand voltage operation, in other words, a thin gate oxide film and a thick gate oxide film are formed on the transistor with low voltage operation and the transistor with high withstand voltage operation, respectively, in a case where the transistor with low voltage operation and the transistor with high withstand voltage operation are mixedly mounted on the integrated circuit. In this case, a gate oxidization step should-be performed twice, which leads to an increase of steps. Further, in a case where two separate gate oxidization steps are performed, it is difficult to control the thickness of the gate oxide film with high precision. In the transistor for aiming at the low voltage operation, the gate oxide film is very thin, and thus, the precision of the thickness largely affects the circuit characteristics. Therefore, it is extremely difficult to mixedly mount the transistor with low voltage operation and the transistor with high withstand voltage operation on the semiconductor integrated circuit.

Further, a circuit that requires the transistor with high withstand voltage operation is an interface circuit in many cases, and this interface circuit is driven with a large current. Thus, generation of heat of the transistor is large. Particularly in a case where this transistor is a SOI device, since the transistor is covered by the oxide film, generated heat cannot be radiated. Therefore, the temperature of the transistor rises, which leads to change in the characteristics and heat destruction.

In addition, the protective transistor for static electricity of the SOI device that operates with a low voltage, the SOI layer is thin, and the source and drain regions reach the insulating film on the supporting substrate. Thus, the junction area of the PN junction is very small in comparison with the bulk device. Therefore, static electricity cannot be completely released with the protective transistor for static electricity with the same size as that used in the conventional bulk device, and thus, this transistor reaches static electricity destruction and Joule heat destruction. Accordingly, the size of the protective transistor is very large. Besides, since the SOI device is covered with the oxide film, there is no current path for a case where negative static electricity enters the transistor.

Therefore, there is a problem in that the transistor has to be further added with the diode for dealing with negative static electricity. Further, in a case where the protective transistor is the SOI device, the transistor is covered with the oxide film, and thus, the temperature of the transistor rises because the heat generated in releasing static electricity cannot be radiated. This leads to changes in the characteristics and heat destruction.

SUMMARY OF THE INVENTION

According to the present invention, in a semiconductor integrated circuit in which a CMOS transistor is formed on an layer, a high withstand voltage transistor is formed, which is constituted of a hole or opening that passes through the SOI layer and reaches an insulating film on a supporting substrate, a gate electrode comprised of the SOI layer surrounded by the hole and an oxide film, a gate oxide film comprised of the insulating film on the supporting substrate, and source and drain regions formed in the supporting substrate at a bottom surface of the hole, which contact the insulating film on the supporting substrate. A transistor that operates with a low voltage is formed on the SOI layer, and a transistor that operates with a high withstand voltage is formed by a transistor having the structure of the present invention. Therefore, the transistor with low voltage operation and the transistor with high withstand voltage can be mixedly mounted on the semiconductor integrated circuit formed on the SOI layer, and also it is sufficient that a gate oxidization step is performed once. Thus, low cost is realized. Further, a large current is flown in the transistor with high withstand voltage, which is used on a transistor chip with low voltage operation in many cases. However, a current flows on the surface of the supporting substrate so that the generated heat spreads over the whole supporting substrate. Thus, a local temperature rise is avoided.

In the transistor constituted of the hole that passes through the SOI layer and reaches the insulating film on the supporting substrate, the gate electrode comprised of the SOI layer surrounded by the hole and the oxide film, the gate oxide film comprised of the insulating film on the supporting substrate, and the source and drain regions formed on the portions of the bottom surface of the hole, which contact the insulating film on the supporting substrate, the transistor has polysilicon formed on the gate electrode comprised of the SOI layer through the oxide film, and the polysilicon contacts a side surface and a part of the bottom surface of the hole and is connected with the gate electrode comprised of the SOI layer. By using the transistor structured above as a protective transistor for static electricity, since the thickness of the gate oxide film at the end of the drain region is the same as that of the gate oxide film of the internal circuit, an avalanche breakdown voltage becomes the same. Thus, static electricity can be released. Further, after the avalanche breakdown, bipolar operation starts. However, since the source and drain regions are formed on the supporting substrate, an area of a PN junction of the transistor corresponds to a thickness of the SOI layer multiplied by a channel width plus bottom surfaces of the source and drain regions, and an allowable current to heat destruction of a junction portion becomes very large. Thus, the transistor can be formed with a smaller size compared with a case where the protective transistor is formed by the SOI device. Moreover, the transistor has a current path from the supporting substrate to the drain region for a case where negative static electricity enters the transistor, and thus, the diode does not have to be added. Furthermore, since the entered static electricity flows on the supporting substrate, the generated heat is radiated through the supporting substrate. Thus, the allowable current to the heat destruction becomes large.

DETAILED DESCRIPTION OF THE PREFERRED EMBODIMENTS

A semiconductor integrated circuit according to the present invention is described with reference to the accompanying drawings.

Figure 1A:
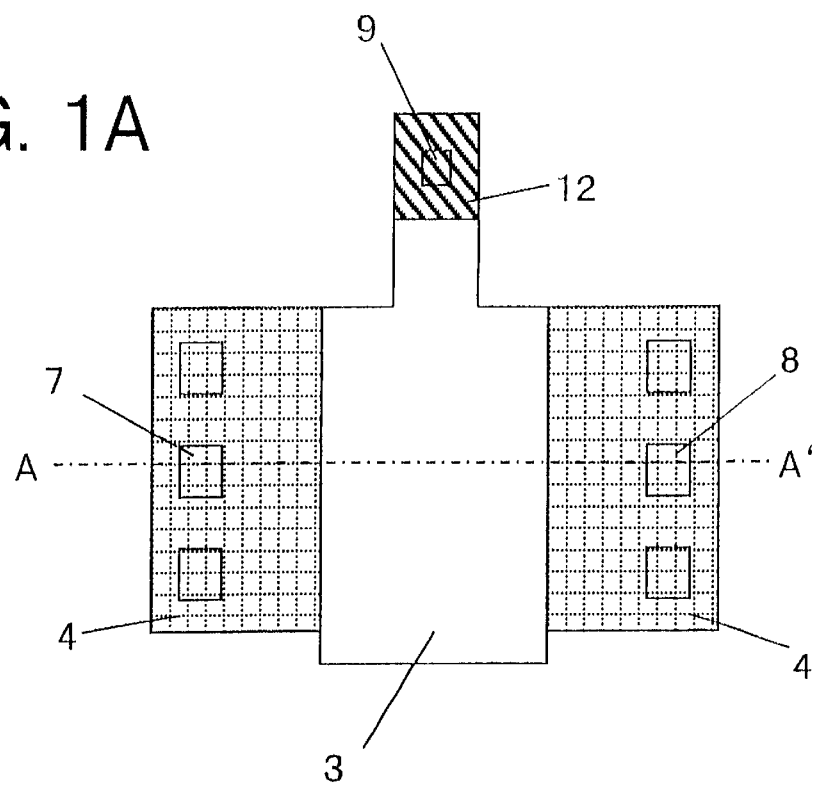
FIGS. 1A and 1B are diagrams showing a structure of a transistor of the present invention.
Figure 1B:
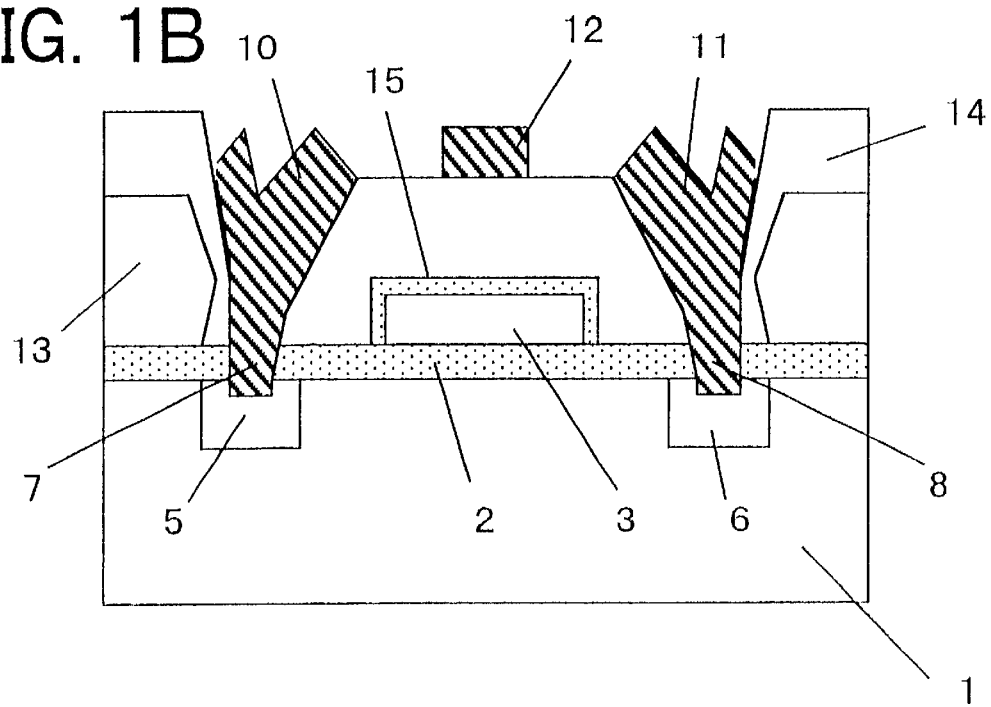

FIG. 1A is a plan view of a transistor in accordance with a first embodiment of the present invention, which is seen from the upper surface. Further, FIG. 1B is a cross sectional view taken along a line A–A' (a width direction of a gate) in FIG. 1A. A hole 4 passes through an SOI layer and reaches an insulating film 2 on a supporting substrate 1. A source region 5 and a drain region 6 are formed in portions of a bottom surface of the hole 4, which contact the insulating film 2 on the supporting substrate 1. The transistor of the present invention uses the insulating film 2 on the supporting substrate 1 as a gate oxide film. Further, a gate electrode corresponds to the SOI layer 3 surrounded by the hole 4 and an oxide film. Here, the gate electrode constituted of the SOI layer 3 is covered by the oxide film 15 formed in a gate oxidization step of the semiconductor integrated circuit manufacturing process. Moreover, the SOI layer except for the portion relating to the structure of the transistor of the present invention is insulated by forming a LOCOS 13 or a trench. Therefore, the SOI layer 3 used as the gate electrode is insulated from other transistors, the supporting substrate 1, and the source and drain regions 5 and 6. The source and drain regions 5 and 6 are connected with metal wirings 10 and 11 on an interlayer insulating film 14 through contacts 7 and 8, respectively. The gate electrode formed by the SOI layer 3 is connected with a metal wiring 12 through a contact 9.

The transistor of the present invention is described in detail here. In the transistor for aiming at the operation with low voltage, the thickness of the SOI layer is 100 nm or less, and the thickness of the insulating film on the supporting substrate is approximately 100 nm. On the other hand, the gate oxide film of the transistor with the low voltage operation is very thin with a thickness of 10 nm or less. Therefore, it is difficult to handle a high voltage in terms of a withstand voltage of the oxide film. However, in a circuit such as a system LSI, it is required that a transistor with low voltage operation and a transistor with high voltage operation are mixedly mounted on one chip. In particular, a high voltage and a large current are required in an interface circuit connected with the outside. According to the present invention, by using the transistor constituted of the gate electrode formed by the SOI layer 3, the gate oxide film comprised of the insulating film 2 on the supporting substrate 1, and the source and drain regions 5 and 6 formed on the supporting substrate 1, the transistor with a thick gate oxide film can be structured on a transistor chip with the low voltage operation. Thus, the transistor with high withstand voltage can be obtained. In addition, a large current may flow in the interface circuit, but a current flows on the surface of the supporting substrate 1 in the transistor of the present invention so that the generated heat spreads over the whole supporting substrate 1. Thus, a local temperature rise is avoided.

Figure 2A:
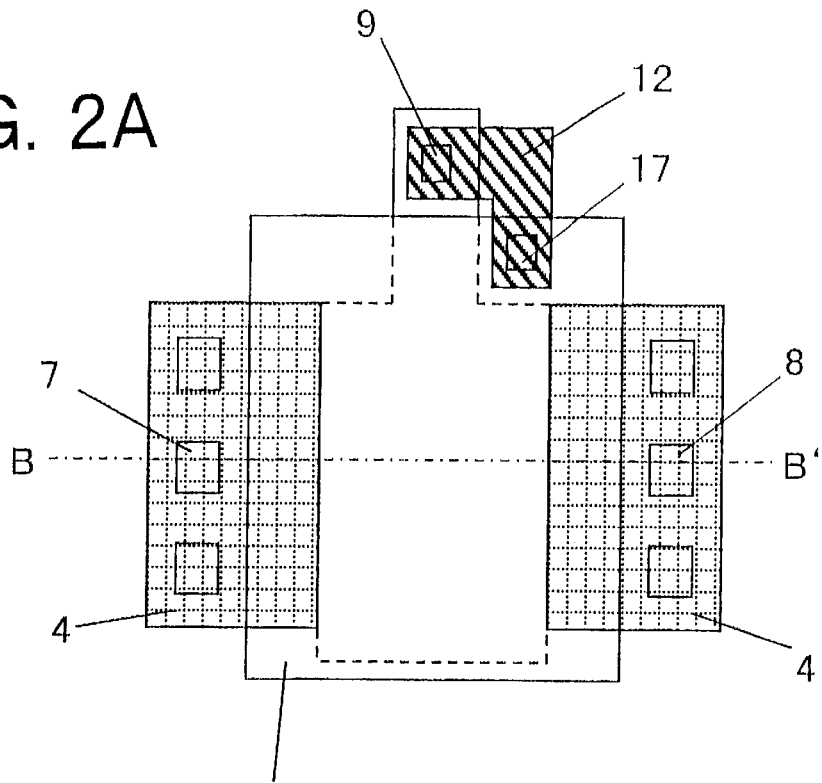
FIGS. 2A and 2B are diagrams showing another embodiment mode of a transistor of the present invention.
Figure 2B:
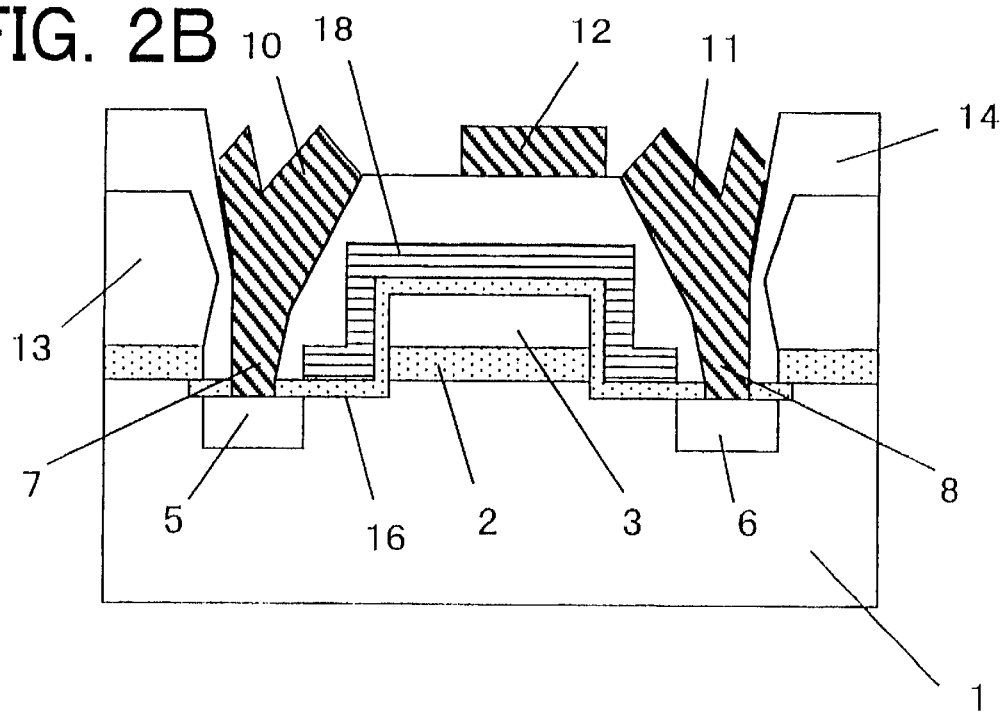
Figure 3A:
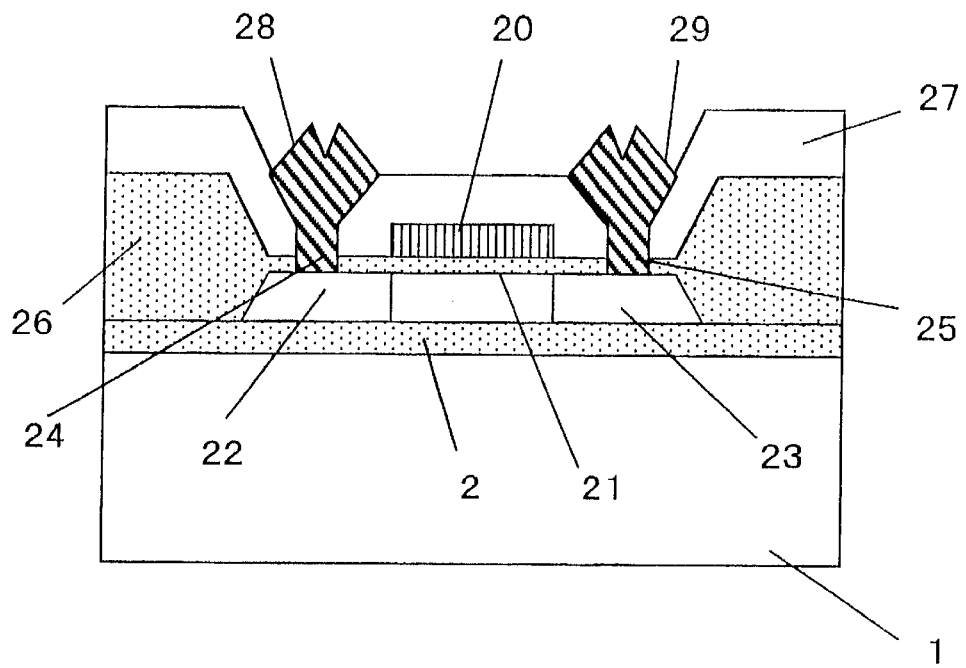
FIGS. 3A and 3B are structural diagrams of a conventional transistor.
Figure 3B:
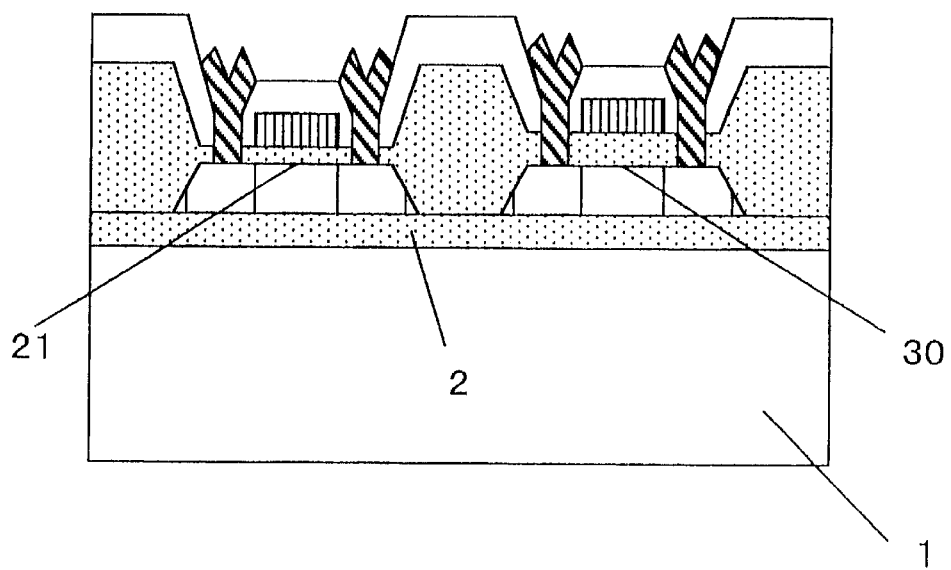

A second embodiment of the present invention is explained with reference to FIGS. 2A and 2B. FIG. 2A is a plan view of a transistor in accordance with the second embodiment, which is seen from the upper surface. Further, FIG. 2B is a cross-sectional view taken along a line B–B' in a width direction of a gate in FIG. 2A. A polysilicon electrode 18 is formed on the gate electrode formed by an SOI layer 3. As shown in FIGS. 2A and 2B, a hole 4 passes through the SOI layer 3 and an insulating film 2 on a supporting substrate 1 and reaches the surface of the supporting substrate 1. An upper surface of the SOI layer 3 forming the gate electrode, side surfaces of the SOI layer 3 which contact the hole 4, and a bottom surface of the hole 4 are covered with an oxide film 16. This oxide film 16 is the same as the gate oxide film of the transistor with low voltage operation, which is formed on the same chip. Further, polysilicon is formed so as to cover the upper surface of the SOI layer 3 forming the gate electrode, the side surfaces of the SOI layer 3 which contact the hole 4, and a part of the bottom surface of the hole 4. Source and drain regions 5 and 6 are formed in portions of the bottom surface of the hole 4, which are not covered by the polysilicon contacting the insulating film 16, in a self-aligning manner. The source and drain regions 5 and 6 are connected with metal wirings 10 and 11 on an interlayer insulating film 14 through contact holes 7 and 8. The gate electrode formed by the SOI layer 3 and the polysilicon are connected with a metal wiring 12 through contacts 9 and 17, and have the same potential.

The transistor structured as described above is effective as, in particular, a protective transistor for releasing static electricity. In case of the transistor with the gate oxide film as the insulating film 2 on the supporting substrate 1 which is shown in the first embodiment of the present invention, capacity to release static electricity is small because of a high withstand voltage. Since the gate oxide film is thick, avalanche breakdown is difficult to occur, and thus, the transistor of an internal circuit reaches the avalanche breakdown earlier. Therefore, static electricity flows through the internal circuit so that the transistor is broken down. On the contrary, in the transistor shown in the second embodiment of the present invention, since the thickness of the gate oxide film 16 at the end of the drain region 6 is the same as that of the gate oxide film of the internal circuit, an avalanche breakdown voltage becomes the same. Thus, static electricity can be released. Further, after the avalanche breakdown, bipolar operation starts. However, since an area of a PN junction of source and drain regions and a body region corresponds to (thickness of an SOI layer)×(channel width) in an SOI device, an allowable current to heat destruction of a junction portion is limited on the above area. On the contrary, in the transistor of the present invention, the source and drain regions 5 and 6 are formed on the supporting substrate 1, and thus, the area of the PN junction corresponds to (thickness of an SOI layer)×(channel width) plus bottom surfaces of the source and drain regions 5 and 6. Therefore, the allowable current to the heat destruction of the junction portion becomes very large, and the transistor can be formed with a smaller size compared with a case where the protective transistor is formed by the SOI device. Further, in a case where the protective transistor is formed by the SOI device, a diode should be added in order to form a current path for a case where negative static electricity enters the transistor. However, the transistor of the present invention has a current path from the supporting substrate 1 to the drain region 6, and thus, the diode does not have to be added. Furthermore, since a large current flows when the protective transistor releases static electricity, the transistor generates heat. In a case where the protective transistor is formed by the SOI device, there does not exist the portion for releasing the generated heat because the transistor is surrounded by the insulating film. Therefore, the allowable current to the heat destruction is small. On the other hand, in the transistor of the present invention, since the entered static electricity flows on the supporting substrate 1, the generated heat is radiated through the supporting substrate 1. Thus, the allowable current to the heat destruction is large.

The present invention is implemented with the embodiments as described above and has the following effects.

In the semiconductor integrated circuit of the present invention, the transistor having the hole that passes through the SOI layer and reaches the insulating film on the supporting substrate, the gate electrode comprised of the SOI layer surrounded by the hole and the oxide film, the gate oxide film comprised of the insulating film on the supporting substrate and the source and drain regions formed in the portions of the bottom surface of the hole, which contact the insulating film on the supporting substrate is formed. Thus, the transistor with a thick gate oxide film can be structured on the transistor chip with low voltage operation, and the transistor with high withstand voltage can be obtained. In addition, a large current is flown in the transistor with high withstand voltage, which is used on the transistor chip with low voltage operation, in many cases. However, a current flows on the surface of the supporting substrate in the transistor of the present invention so that the generated heat spreads over the whole supporting substrate. Thus, there is obtained an effect that the local temperature rise is avoided.

Further, the transistor of the semiconductor integrated circuit according to the present invention has the hole that passes through the SOI layer and reaches the insulating film on the supporting substrate, the gate electrode comprised of the SOI layer surrounded by the hole and the oxide film, the gate oxide film comprised of the insulating film on the supporting substrate, the source and drain regions formed in the portions of the bottom surface of the hole, which contact the insulating film on the supporting substrate, and the polysilicon formed on the gate electrode comprised of the SOI layer through the oxide film, and is structured such that the polysilicon is connected with the gate electrode comprised of the SOI layer. With such a structure, the transistor is effective as, in particular, the protective transistor for static electricity. Since the thickness of the gate oxide film at the end of the drain region is the same as that of the gate oxide film of the internal circuit, the avalanche breakdown voltage becomes the same. Thus, there is obtained an effect that static electricity is released.

Further, after the avalanche breakdown, the bipolar operation starts. However, since the source and drain regions are formed on the supporting substrate, the area of the PN junction of the transistor corresponds to the thickness of the SOI layer multiplied by the channel width plus the bottom surfaces of the source and drain regions, and the allowable current to the heat destruction of the junction portion is very large. Thus, there is obtained an effect that the transistor can be formed with a smaller size compared with a case where the protective transistor is formed by the SOI device. In addition, the transistor has the current path from the supporting substrate to the drain region for a case where negative static electricity enters the transistor, and thus, there is obtained an effect that the diode does not have to be added. Furthermore, since the entered static electricity flows on the supporting substrate, the generated heat is radiated through the supporting substrate. Thus, there is obtained an effect that the allowable current to the heat destruction becomes large.

What is claimed is:

1. A semiconductor integrated circuit comprising: a supporting substrate; an insulating film provided on the supporting substrate; a semiconductor film provided on the insulating film; and one or more MOS transistors comprising openings formed in the semiconductor film and the insulating film to expose a surface of the supporting substrate, a first gate electrode formed of a portion of the semiconductor film between the openings, a first gate oxide film comprised of a portion of the insulating film on the supporting substrate under the first gate electrode, a second gate oxide film formed on a surface and a sidewall of the first gate electrode and on the supporting substrate at the openings, source and drain regions formed in the supporting substrate at the openings on opposite sides of the first gate electrode and spaced apart from the first gate electrode, and a second gate electrode comprised of a polysilicon film electrically connected to the first gate electrode and formed on the surface of the second gate oxide film directly over the surface and the sidewall of the first gate electrode and directly over surfaces of the supporting substrate at the opening between the first gate electrode and the source and drain regions.

2. A semiconductor integrated circuit according to claim 1; wherein the polysilicon film covers the exposed second gate oxide film at the bottom surface of the opening from the sidewall of the first gate electrode to ends of the source and drain regions closest to the first gate electrode.

3. A semiconductor integrated circuit according to claim 1; further comprising an interlayer insulating film formed on the source and drain regions and the polysilicon film; and source and drain electrodes connected to the source and drain regions through contact holes formed in the interlayer insulating film.

4. A semiconductor integrated circuit according to claim 1; wherein the one or more MOS transistors are high voltage transistors; and further comprising one or more other MOS transistors each comprising source and drain regions formed in the semiconductor film, a gate insulating film formed over the semiconductor film between the source and drain regions, and a gate electrode formed over the gate insulating film.

5. A semiconductor integrated circuit according to claim 4; wherein the source and drain regions of the one or more other MOS transistors extend to an interface between the semiconductor layer and the insulating film provided on the supporting substrate.

6. A semiconductor integrated circuit according to claim 1; wherein the first gate oxide film is thicker than the second gate oxide film.

7. A semiconductor integrated circuit comprising: an SOI substrate having a supporting substrate, an insulating film provided on the supporting substrate, and a semiconductor film provided on the insulating film; one or more low withstand voltage MOS transistors formed in the SOI substrate and comprising source and drain regions formed in the semiconductor film, a gate insulating film formed over the semiconductor film between the source and drain regions, and a gate electrode formed over the gate insulating filmy and one or more high withstand voltage MOS transistors formed in the substrate and comprising openings formed in the semiconductor film and the insulating film to expose a surface of the supporting substrate, a first gate electrode formed of a portion of the semiconductor film between the openings, a first gate oxide film comprised of the insulating film on the supporting substrate under the first gate electrode, a second gate oxide film formed on a surface and a sidewall of the first gate electrode and on the supporting substrate at the openings, source and drain regions formed in the supporting substrate at the openings on opposite sides of the first gate electrode and spaced apart from the first gate electrode, and a second gate electrode comprised of a polysilicon film electrically connected to the first gate electrode and formed on the surface of the second gate oxide film directly over the surface and the sidewall of the first gate electrode and directly over surfaces of the supporting substrate at the openings between the first gate electrode and the source and drain regions.

8. A semiconductor integrated circuit according to claim 7; wherein the polysilicon film covers the bottom surface of the opening from the sidewall of the first gate electrode to ends of the source and drain regions closest to the first gate electrode.

9. A semiconductor integrated circuit according to claim 7, wherein the one or more high withstand voltage MOS transistors further comprise an interlayer insulating film formed on the source and drain regions and the polysilicon film; and source and drain electrodes connected to the source and drain regions through contact holes formed in the interlayer insulating film.

10. A semiconductor integrated circuit according to claim 7, wherein the first gate oxide film is thicker than the second gate oxide film.

* * * * *